United States Patent
Ishikawa et al.

(10) Patent No.: US 7,564,294 B2
(45) Date of Patent: *Jul. 21, 2009

(54) INVERTER APPARATUS

(75) Inventors: Katsumi Ishikawa, Chiyoda-ku (JP);
Hideki Miyazaki, Chiyoda-ku (JP);
Koichi Suda, Chiyoda-ku (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/962,608

(22) Filed: Dec. 21, 2007

(65) Prior Publication Data

US 2008/0106320 A1    May 8, 2008

Related U.S. Application Data

(63) Continuation of application No. 11/191,023, filed on Jul. 28, 2005, now Pat. No. 7,336,118.

(30) Foreign Application Priority Data

Aug. 10, 2004   (JP) .............................. 2004-232886

(51) Int. Cl.
*H03K 17/60* (2006.01)
(52) U.S. Cl. ...................................... 327/432; 327/434
(58) Field of Classification Search ......... 327/108–112, 327/333, 423, 424
See application file for complete search history.

(56) References Cited

U.S. PATENT DOCUMENTS

| 5,828,112 | A  | 10/1998 | Yamaguchi |
| 6,885,225 | B2 | 4/2005 | Ohmichi et al. |
| 2003/0197553 | A1 | 10/2003 | Itakura et al. |

FOREIGN PATENT DOCUMENTS

JP         08-298786       11/1996

*Primary Examiner*—Lincoln Donovan
*Assistant Examiner*—Colleen O'Toole
(74) *Attorney, Agent, or Firm*—Crowell & Moring LLP

(57) ABSTRACT

To provide a highly reliable inverter apparatus which discriminates long-cycle noise generated by the isolated signal transmission element from short-cycle dv/dt noise and induction noise.

A low pass filter, band pass filter, and a switching means are provided between the input section of the gate drive circuit of the voltage-drive type power semiconductor switching element and the isolated signal transmission means that transmits the output of the control circuit; and an abnormal signal discriminating circuit is also provided which turns on and off the switching means according to the output of the band pass filter thereby eliminating long-cycle noise derived from the isolated signal transmission element, short-cycle dv/dt noise, and induction noise; and also outputs alarm signals.

2 Claims, 7 Drawing Sheets

| TEST INPUT SIGNAL | GATE VOLTAGE | ABNORMAL SIGNAL OUTPUT |
|---|---|---|
| PATTERN 1 (~ 0.5μs) | CONFIRMATION OF GATE VOLTAGE 0V | NONE |
| PATTERN 2 (0.5 ~ 3μs) | CONFIRMATION OF GATE VOLTAGE 15V | PRESENCE |
| PATTERN 3 (3μs ~) | CONFIRMATION OF GATE VOLTAGE 15V (CONFIRMATION OF COLLECTOR VOLTAGE) | NONE |

INVERTER APPARATUS

CLAIM OF PRIORITY

This application is a continuation of U.S. patent application Ser. No. 11/191,023 filed Jul. 28, 2005, which claims priority from Japanese application serial no. 2004-232886, filed on Aug. 10, 2004, the content of which is hereby incorporated by reference into this application.

FIELD OF THE INVENTION

The present invention relates to a semiconductor power conversion device, specifically relates to a highly reliable inverter apparatus.

BACKGROUND OF THE INVENTION

Generally, power semiconductor elements, such as a MOSFET and an IGBT, are used in the main circuit of an inverter section of an inverter apparatus, and a voltage of 42 V to 600 V is applied to the main circuit. Furthermore, each of drive circuits for driving and protecting each of power semiconductor elements is supplied an isolated power source for driving the element based on the power ground potential of the source terminal of the MOSFET or the emitter terminal of the IGBT as a reference potential, individually. On the other hand, the output signal of the control circuit that performs the ON/OFF control of the power semiconductor elements according to an external command uses a signal ground potential as a reference potential.

The output signal of this control circuit must be inputted into the drive circuit of the power semiconductor element that uses a power ground potential (source potential or emitter potential of MOSFET or IGBT) as a reference potential, and therefore, the signal must be isolated. As a means for transmitting the signal while providing adequate isolation, that is, as an isolated signal transmission means, an optical isolation system, such as a photo-coupler and a digital link, is widely known. For example, the technology disclosed in Japanese Patent Laid-open No. Hei 08 (1996)-298786 (FIG. 2, and descriptions in Sections 0010 and 0011) uses a photo-coupler.

When a photo-coupler is used, depending on the ratio of change over time (dv/dt) of the main circuit voltage that occurs at the switching of the power semiconductor element, a displacement current flows through the stray capacitance that exists between the primary side and the secondary side of the photo-coupler, and the current enters the drive circuit, which may cause a malfunction. Therefore, it is necessary to use a photo-coupler that has a high common mode rejection ratio (CMRR) and a high dv/dt (voltage shift ratio) resistance.

However, it is extremely difficult to completely eliminate noise that occurs on the secondary side of the photo-coupler, that is, in an input signal of the drive circuit. Therefore, as shown in FIG. 3, in well-known conventional technology, a low pass filter 21 is provided in the input section of the drive circuit and protection circuit 33 to eliminate noise.

SUMMARY OF THE INVENTION

Inverter apparatus, specifically inverter apparatus for automobiles and inverter apparatus for trains, have been using larger current as the result of the small-scale packaging, higher battery voltage and overhead power line voltage, and the increase of the motor rating. With the use of higher battery voltage and overhead power line voltage, the main circuit's direct current voltage becomes high. Accordingly, dv/dt that occurs at the switching of the power semiconductor element increases, thereby the noise that occurs on the secondary side of the photo-coupler, that is, in the drive circuit's input signal tends to increase.

Furthermore, with the small-scale packaging of the inverter apparatus and larger current of the inverter apparatus, a large current flows through an adjacent conductor inside the inverter apparatus. Thus, electromagnetic induction tends to increase noise that occurs in the photo-coupler's secondary side input signal. To avoid this noise, it is necessary to increase the time constant of the low pass filter provided in the drive circuit's input part so as to change the cutoff frequency to a lower frequency, thereby sufficiently reducing the noise. However, when the time constant of the low pass filter increases, transmission delay of the drive signal sent from the control circuit becomes considerably large, causing the motor's control response to delay. This is a problem.

Furthermore, it is well-known that optical isolation elements, typified by a photo-coupler, easily malfunction when it is operated in a high temperature environment. To prevent the malfunction, there is a method that further increases the time constant of the low pass filter so as to remove long-cycle noise which interferes with the photo-coupler's secondary side output signal. However, as previously stated, there is a problem in that transmission delay of the signal sent from the control circuit increases, causing the motor's control response to delay.

The objective of the present invention is to provide a highly reliable inverter apparatus that discriminates between long-cycle noise derived from an isolated signal transmission element, and short-cycle dv/dt noise and induction noise, thereby detecting malfunctions caused by high-temperature operation or deterioration by aging.

An inverter apparatus according to the present invention has an abnormal signal discriminating circuit which is located between an isolated signal transmission element for the drive signal and a drive circuit and protection circuit's input section so that the abnormal signal discriminating circuit discriminates long-cycle noise derived from the isolated signal transmission element from short-cycle dv/dt noise and induction noise, thereby avoiding malfunctions.

According to the present invention, it is possible to provide a highly reliable inverter apparatus that discriminates long-cycle noise derived from an isolated signal transmission element from short-cycle dv/dt noise and induction noise and reliably detects malfunctions caused by high-temperature operation or deterioration by aging.

DESCRIPTION OF THE PREFERRED EMBODIMENTS

Embodiments of the present invention will be explained in detail with reference to the drawings.

Embodiment 1

Figure 1:
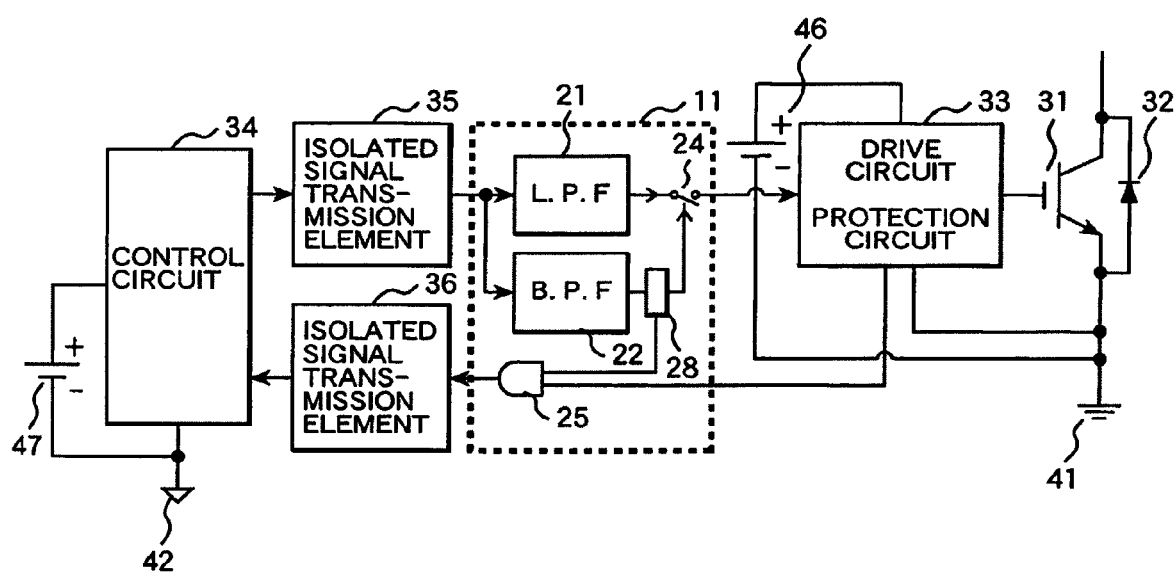
FIG. 1 is a circuit block diagram of embodiment 1.

FIG. 1 is a circuit block diagram of one arm of an inverter apparatus according to this embodiment. As shown in FIG. 1, free wheel diode 32 is reverse-parallel connected between the collector and the emitter which are main terminals of an IGBT (Isolated Gate Bipolar Transistor) 31, thereby forming one arm of the inverter's main circuit. This embodiment is an inverter apparatus that adds a pulse-width modulated (PWM) drive signal to the gate which is a control terminal of the IGBT 31, converts a direct current voltage into a frequency-variable, three-phase alternating current voltage, and outputs it. Therefore, the inverter apparatus has a full bridge circuit in which three sets of similar arms are vertically connected in series although the circuit is not shown in FIG. 1. And a three-phase alternating current voltage is outputted from each junction of the upper and lower arms, and is supplied to an induction motor or a synchronous motor which functions as a load.

In this embodiment, as shown in FIG. 1, an output signal is sent from the drive circuit and protection circuit 33, which uses the potential of the power ground 41 of the IGBT's 31 emitter terminal as a reference potential, to the gate which is the control electrode of the IGBT 31, thereby conducting both the switching operation and the protection operation of the IGBT 31. A drive circuit and protection circuit 33 of this embodiment is an IC that is formed on a dielectric isolated substrate, but it may be a drive circuits in which discrete semiconductors are disposed on a circuit board.

A control power source 46 that is isolated by a transformer or the like is used as a power source for the drive circuit and protection circuit 33, and the voltage of the control power source 46 is usually between 10 V and 30 V, or between 15 V and 12 V. On the other hand, a control circuit 34 which uses the potential of the signal ground 42 as a reference potential has a CPU with the RAM, ROM, and EPROM built-in, and is disposed on a circuit board that is not shown in FIG. 1. The power source voltage of the control circuit 34 is usually 5 V or 3.3 V, which is different from the voltage of the control power source 46 of the drive circuit and protection circuit 33.

In this embodiment, an output signal of the control circuit 34 which uses the potential of the signal ground 42 as a reference potential is converted into an input signal of the drive circuit and protection circuit 33 which uses a different reference potential, and the signal is transmitted. Therefore, an isolated signal transmission element 35 for drive signal is provided. On the contrary, in order to convert an alarm signal, outputted by the drive circuit and protection circuit 33 which uses the potential of the power ground 41 as a reference potential, into an input signal of the control circuit 34 which uses a different reference potential, another isolated signal transmission element 36 is also provided. Optical isolation elements such as a pulse transformer, photo-coupler, and a digital link, and a capacitance coupled element can be used as such isolated signal transmission elements 35 and 36. Moreover, the isolated signal transmission element 35 and the isolated signal transmission element 36 can be the same kind of elements or different kinds of elements as far as the elements satisfy the required signal transmission speed and isolation resistance.

Figure 3:
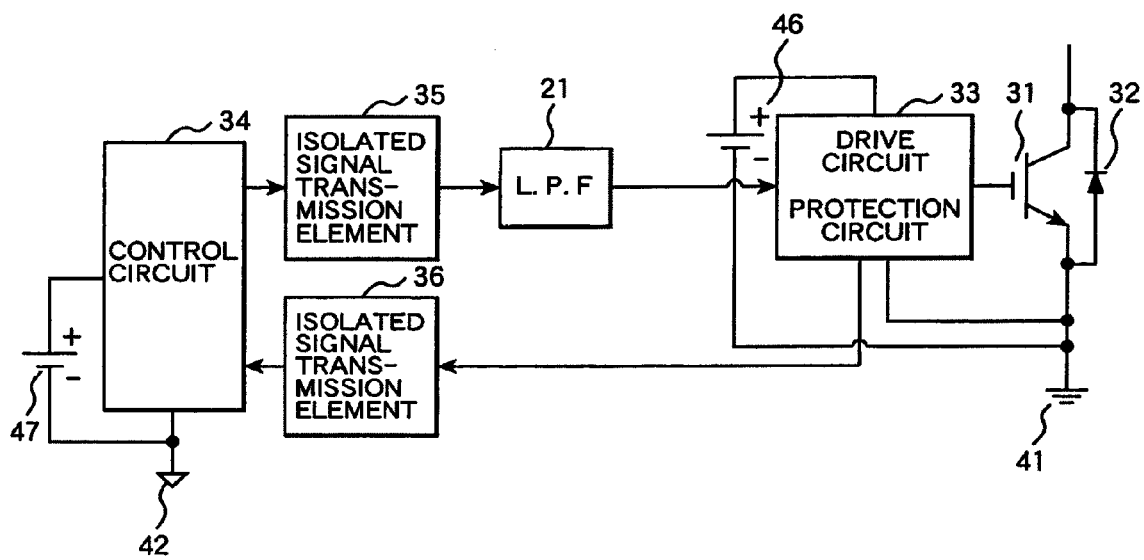
FIG. 3 is a circuit block diagram of the conventional art.

This embodiment is different from the conventional inverter apparatus shown in FIG. 3 in the point that this embodiment has an abnormal signal discriminating circuit 11 located between the isolated signal transmission element 35 for drive signal and the input section of the drive circuit and protection circuit 33.

The abnormal signal discriminating circuit 11 of this embodiment has a low pass filter 21, a band pass filter 22 and a switch 24 so as to detect whether an abnormal signal is present in the input signal that uses the potential of the power ground 41 as a reference potential. The gate drive signal of the IGBT 31 is inputted into the low pass filter 21 and the band pass filter 22 from the control circuit 34 via the isolated signal transmission element 35. An output of the low pass filter 21 is inputted into the drive circuit and protection circuit 33 via the switch 24. Furthermore, the band pass filter 22 separates the abnormal signal's frequency component contained in the input signal from the drive signal, and inputs the signal into the abnormal signal detecting and discriminating section 28. The abnormal signal detecting and discriminating section 28 turns off the switch 24 when it has detected an abnormal signal so as to cut off the output of the low pass filter 21, and when it has not detected an abnormal signal, it turns on switch 24 to allow the output of the low pass filter 21 to pass.

Both an abnormal signal detection output of the abnormal signal detecting and discriminating section 28 and an abnormal signal outputted by the drive circuit and protection circuit 33 are inputted into the AND circuit 25, and an alarm signal outputted by the AND circuit 25 is transmitted to the control circuit 34 via the isolated signal transmission element 36. Thus, in this embodiment, a plurality of abnormal signals are inputted into the AND circuit 25 and logical product is outputted, thereby avoiding unnecessary interruptions in operation and increasing reliability of the inverter apparatus.

In the inverter apparatus of this embodiment, the frequency of the carrier when generating a PWM signal for driving an IGBT 31 is 10 kHz, and the cut-off frequency (frequency for −3 dB) of the low pass filter 21 is 2 MHz. Furthermore, the lower-limit frequency (frequency for −3 dB) of the pass-band width of the band pass filter 22 is 300 kHz, and the upper-limit frequency (frequency for −3 dB) is 2 MHz. In this embodiment, the cut-off frequency of the low pass filter 21 is properly set so that dv/dt noise with a cycle of 500 ns to 600 ns and electromagnetic induction noise can be eliminated.

In this embodiment, to detect and eliminate noise derived from an optical isolation element, the bandwidth of the band pass filter 22 is properly set so that noise with a cycle of 500 ns to 3 μs can pass. This also means that the maximum pulse width that can pass the band pass filter 22 is set at the minimum ON pulse width of the control circuit's output signal or a pulse width shorter than the minimum OFF pulse width.

Figure 2:
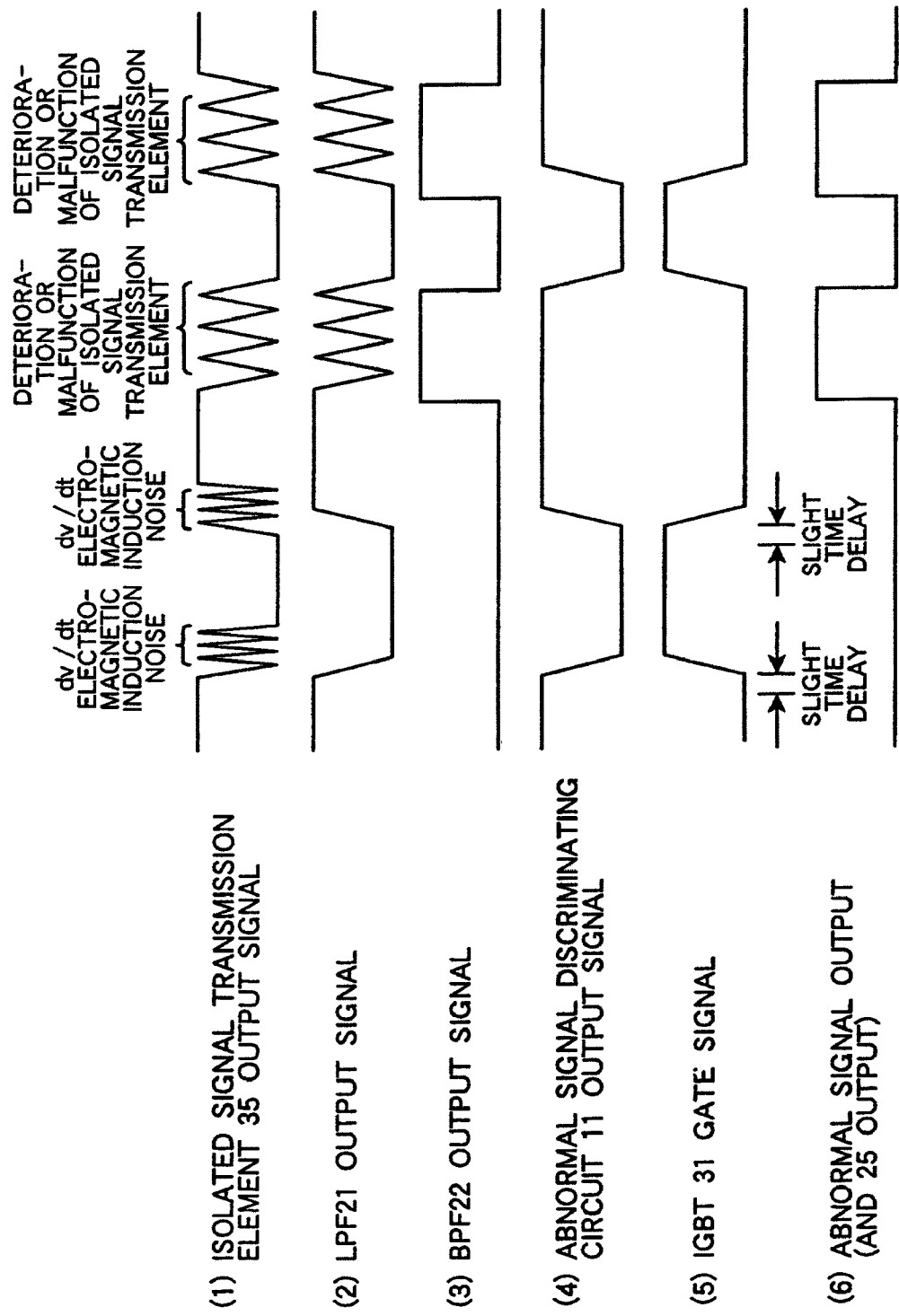
FIG. 2 is a time chart of embodiment 1.

With reference to the time chart in FIG. 2, operations of the abnormal signal discriminating circuit 11 of this embodiment will be explained in detail. FIG. 2 (1) shows the waveform of the gate drive signal that has been outputted from the control circuit 34 via the isolated signal transmission element 35. In the signal waveform shown in FIG. 2 (1), an original drive signal superposes with dv/dt noise, electromagnetic induction noise, and noise derived from an optical isolation element such as a photo-coupler that is an isolated signal transmission element 35.

FIG. 2 (2) shows the output waveform of the low pass filter 21. Usually, the cycle of dv/dt noise and electromagnetic induction noise is between 500 ns and 600 ns. In the output waveform of the low pass filter 21 of this embodiment, noise of this cycle is suppressed and is lower than the threshold voltage of the logic circuit. However, the noise with a cycle of 500 ns to 3 μs derived from an optical isolation element passes the low pass filter 21.

FIG. 2 (3) shows the output signal waveform of the band pass filter 22 of this embodiment. The waveform of the band pass filter 22 output corresponds to noise generated by an optical isolation element shown in FIG. 2 (1).

FIG. 2 (4) shows the waveform of the signal outputted by the abnormal signal discriminating circuit 11 of this embodiment to the drive circuit and protection circuit 33, and FIG. 2 (5) shows the signal that is added to the gate of the IGBT 31.

Both an abnormal signal that was contained in the output of the band pass filter 22 and detected and outputted by the abnormal signal detecting and discriminating section 28 and an abnormal signal outputted by the drive circuit and protection circuit 33 are inputted into the AND circuit 25, and FIG. 2 (6) shows the waveform of the signal outputted by the AND circuit 25. Moreover, although an explanation is out of sequence, an abnormal signal detected and outputted by the abnormal signal detecting and discriminating section 28 turns off the switch 24 to cut off any output of the low pass filter 21, thereby eliminating noise from the gate drive signal as shown in FIG. 2 (4) and normalizing the signal.

As stated above, according to this embodiment, it is possible to discriminate noise, which is generated by malfunction of an isolated signal transmission element caused by high-temperature operation or deterioration by aging, from dv/dt noise and induction noise. Therefore, because an abnormality that occurs in the control circuit can be detected as soon as possible, it is possible to increase reliability of inverter apparatus for automobiles and inverter apparatus for trains.

An explanation has been given in which the low pass filter 21 and the band pass filter 22 of this embodiment are configured as analog filters, and an active filter that uses an element such as an RC filter, LC filter, crystal filter, ceramic filter, and an operation amplifier is used as an analog filter.

In this embodiment, it is possible to configure the low pass filter 21 and the band pass filter 22 as digital filters. The use of a microcomputer or a DSP (Digital Signal Processor) for processing signals makes it possible to remove noise that has interfered with the signal. By installing a microcomputer or a DSP in the abnormal signal discriminating circuit 11 shown in FIG. 1, it is possible to provide highly reliable inverter apparatus.

Embodiment 2

Figure 4:
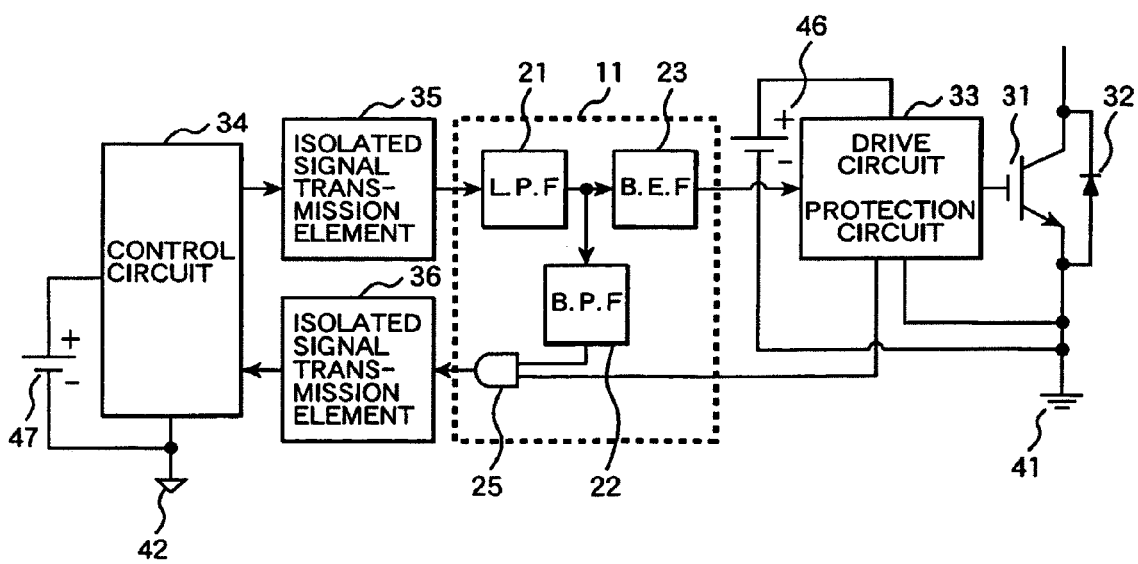
FIG. 4 is a circuit block diagram of embodiment 2.

FIG. 4 is a circuit block diagram of this embodiment. In FIG. 4, identical numbers are assigned to identical parts shown in FIG. 1 and descriptions of the identical parts are omitted.

The abnormal signal discriminating circuit 11 of this embodiment is equipped with a low pass filter 21, a band pass filter 22 and a band eliminating filter 23. In this embodiment, in the same manner as the configuration of embodiment 1 shown in FIG. 2, dv/dt noise and electromagnetic induction noise are removed by the low pass filter 21, and noise derived from an isolated signal transmission element 35 is filtered by the band pass filter 22 to detect any abnormality, and then the signal is transmitted to the control circuit 34 via the isolated signal transmission element 36. In this embodiment, instead of providing a switch 24 that is provided in embodiment 1, an output of the low pass filter 21 is filtered through the band eliminating filter 23, thereby removing noise caused by malfunction of the element that transmits the isolated signal with a cycle of 500 ns to 3 μs and normalizing the gate drive signal. Herein, the lower-limit noise-elimination frequency of the band eliminating filter is 300 kHz, and the upper-limit noise-elimination frequency is 2 MHz. Moreover, in this embodiment, an output of the low pass filter 21 is inputted into the band pass filter 22 to detect any abnormality; however, in the same manner as embodiment 1, a signal outputted by the isolated signal transmission element 35 may be inputted into the band pass filter 22.

According to this embodiment, it is possible to discriminate noise, which is generated by malfunction of an isolated signal transmission element caused by high-temperature operation or deterioration by aging, from dv/dt noise and induction noise. Therefore, because an abnormality that occurs in the control circuit can be detected as soon as possible, it is possible to increase reliability of inverter apparatus for automobiles and inverter apparatus for trains.

Embodiment 3

Figure 5:
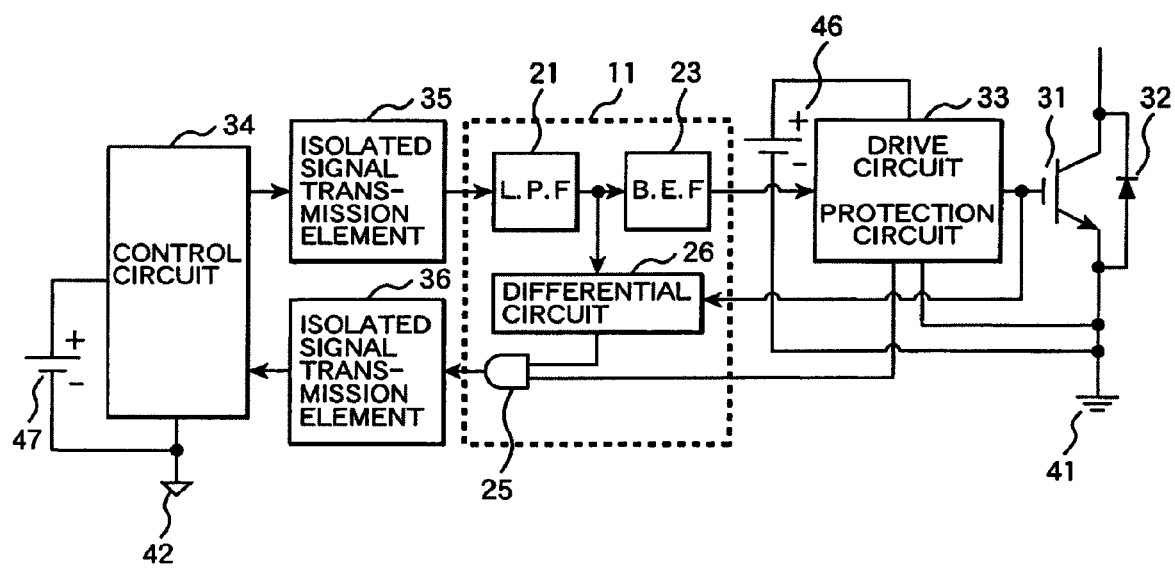
FIG. 5 is a circuit block diagram of embodiment 3.

FIG. 5 is a circuit block diagram of this embodiment. In FIG. 5, identical numbers are assigned to identical parts shown in FIG. 1 and FIG. 4, and descriptions of the identical parts are omitted.

The abnormal signal discriminating circuit 11 of this embodiment is equipped with a low pass filter 21, a band eliminating filter 23, and a differential circuit 26. Moreover, the differential circuit 26 has a waveform correction section, not shown, that shapes an output signal waveform of the low pass filter 21 into a prescribed logic signal level waveform.

In this embodiment, a difference between an output signal of the low pass filter 21 and a gate voltage of the IGBT 31 is detected, and if a difference has been detected, it is determined that noise has been generated by malfunction of the isolated signal transmission element 35 caused by high-temperature operation or deterioration by aging, and an abnormal signal is transmitted to the control circuit 34. Moreover, in this embodiment, the logic signal level (for example, TTL level, CMOS level) of the signal inputted into the differential circuit 26 is the same as the logic (positive logic or negative logic); however, it is clear that even if they are not the same, by properly changing the logic, this embodiment can be applied.

Embodiment 4

Figure 6:
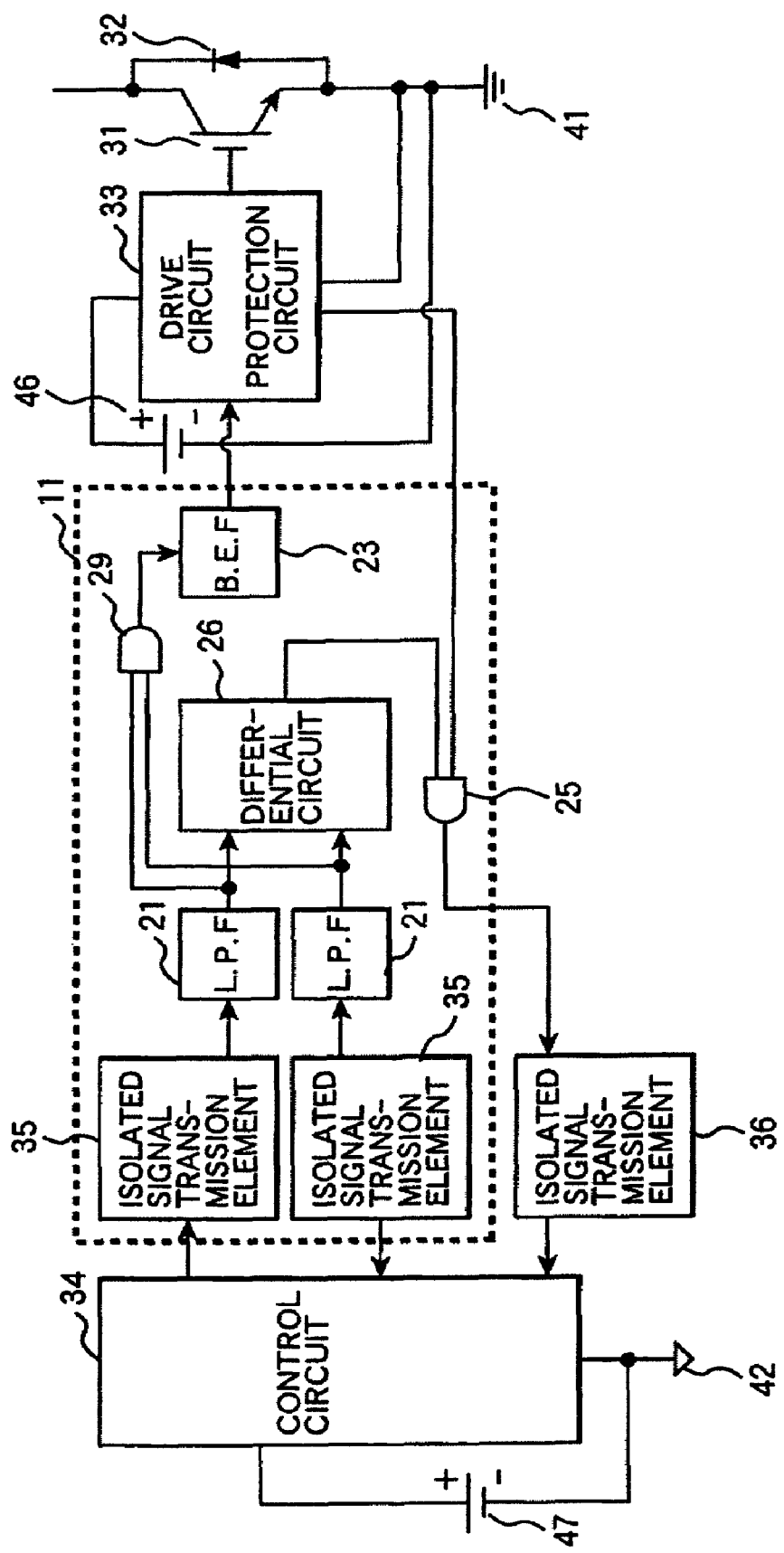
FIG. 6 is a circuit block diagram of embodiment 4.

FIG. 6 is a circuit block diagram of this embodiment. In FIG. 6, identical numbers are assigned to identical parts shown in FIG. 1, FIG. 4 and FIG. 5, and descriptions of the identical parts are omitted.

The abnormal signal discriminating circuit 11 of this embodiment is equipped with two sets of isolated signal transmission elements 35, two sets of low pass filters 21, and a differential circuit 26. In this embodiment, two sets of low pass filters 21 which have the same time constant as that of the isolated signal transmission element 35, that is, the low pass filters 21 which have cut-off frequency of 2 MHz, and differences of those signals are obtained, thereby detecting an abnormal signal that occurs in an input signal in the same manner as embodiments 1 to 3.

Herein, two waveforms of the noise caused by the malfunction or deterioration of two isolated signal transmission elements 35 will not become identical; and therefore, it is possible to reliably detect whether there is any abnormality by detecting a difference between output signals of the two sets of low pass filters 21.

Furthermore, in this embodiment, outputs of two sets of low pass filters are inputted into an AND circuit 29, and the output signal is inputted into the drive circuit and protection circuit 33 via a band eliminating filter 23. Moreover, it is possible to omit the band eliminating filter 23 and output an output signal of the AND circuit 29 directly to the drive circuit and protection circuit 33.

Embodiment 5

Figure 7:
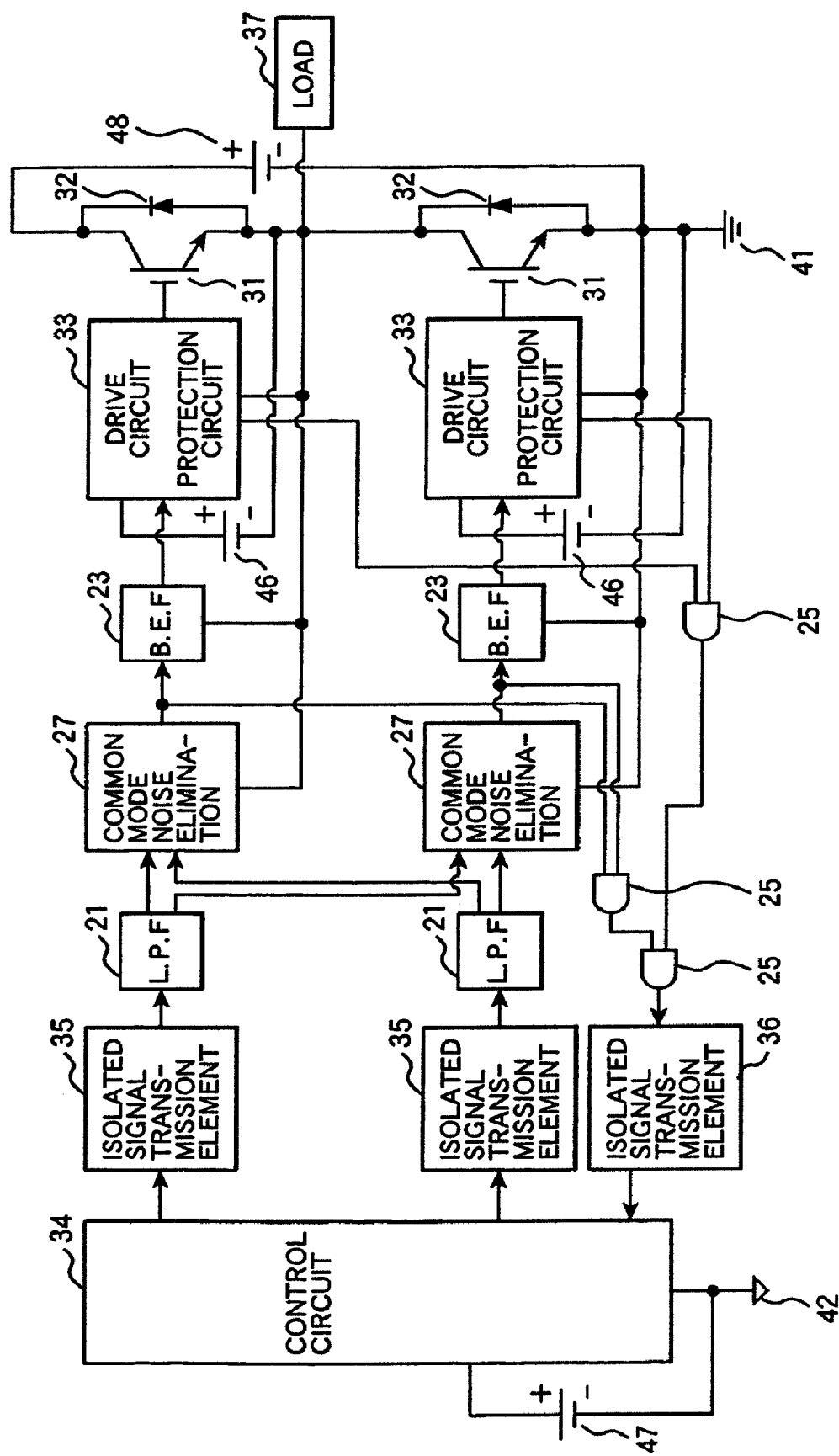
FIG. 7 is a circuit block diagram of embodiment 5.

FIG. 7 is a circuit block diagram of this embodiment. In FIG. 7, identical numbers are assigned to identical parts shown in embodiments 1 to 4, and descriptions of the identical parts are omitted.

In this embodiment, an upper-arm IGBT 31 and a lower-arm IGBT 31 are totem-pole-connected between the positive side of the main power source 48 and the potential of the power ground 41 thereby forming a half bridge, and a plurality of such half bridges are provided although they are not shown in the drawing. A load (inductive load such as a motor) 37 is connected to a junction between the upper-arm IGBT 31 and the lower-arm IGBT 31. A drive circuit and protection circuit 33 and a control power source 46 of each switching element are individually provided on the upper and lower arms. A level-shift circuit that converts the signal level of the drive circuit and protection circuit 33, which uses the potential of the lower-arm power ground 41 as a reference potential, into the signal level of the drive circuit and protection circuit 33 of the upper-arm switching element is built in the drive circuit and protection circuit 33 of the upper-arm switching element.

The abnormal signal discriminating circuit 11 of this embodiment, which detects an abnormal signal generated in the input signal that uses the power ground potential as a reference potential, is equipped with two sets of low pass filters 21 and two sets of common mode noise elimination circuits 27 in addition to two sets of isolated signal transmission elements 35 for the upper arm and the lower arm. The common mode noise elimination circuit 27 is made up of the simultaneous continuity prevention logic. Signals outputted from both the upper-arm side low pass filter 21 and the lower-arm side low pass filter 21 are inputted into the upper-arm side common mode noise elimination circuit 27 to eliminate common mode noise. Since two kinds of noise caused by malfunction of two isolated signal transmission elements 35 or deterioration do not become identical nor appear as common mode noise, it is possible to detect noise generated by malfunction of isolated signal transmission elements 35 caused by high-temperature operation or deterioration by aging by checking the output of the common mode noise elimination circuit 27.

Embodiment 6

Figures 8, 9:
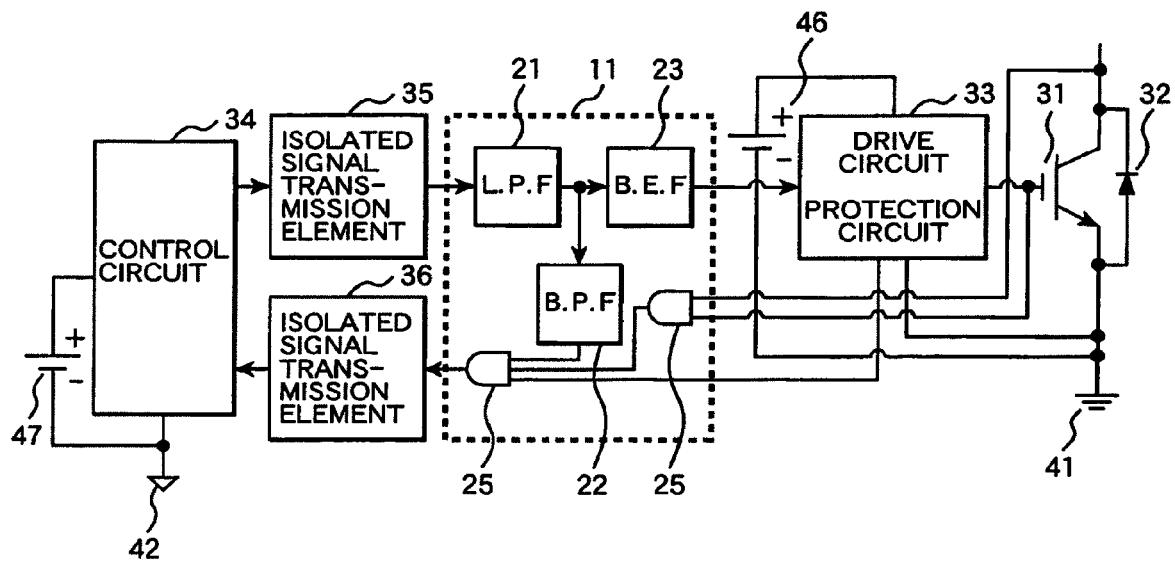
FIG. 8 is a circuit block diagram of embodiment 6.
FIG. 9 is an explanatory drawing that describes the pulse patterns of embodiment 6.

FIG. 8 is a circuit block diagram of this embodiment. In FIG. 8, identical numbers are assigned to identical parts shown in embodiments 1 to 5, and descriptions of the identical parts are omitted.

In addition to the configuration of embodiment 2, this embodiment further comprises a circuit which detects a gate voltage and a collector voltage of the IGBT 31 to detect whether there is an abnormality. In this embodiment, in addition to the description of embodiment 2, the preset test pulse is generated in the control circuit 34, inputted into the gate of the IGBT 31, and then the presence or absence of an abnormality of the IGBT 31 is detected according to the gate voltage and the collector voltage of the IGBT 31.

FIG. 9 shows an example of the pulse pattern of this embodiment. In pattern 1, a signal that cannot pass the low pass filter 21, for example, a signal with a pulse width of 0.5 μs or less is inputted. In pattern 1, since a signal with a pulse of 0.5 μs or less cannot pass the low pass filter 21, the gate drive voltage is 0 V, and an abnormal signal is not outputted to the control circuit 34.

In pattern 2, a signal that cannot pass the band eliminating filter 23, for example, a signal with a pulse width of 0.5 μs to 3 μs is inputted. In pattern 2, since a signal with a pulse width of 0.5 μs to 3 μs cannot pass the band eliminating filter 23, the gate voltage shows the waveform of the control signal. On the other hand, since a signal with a pulse width of 0.5 μs to 3 μs can pass the band pass filter 22, an abnormal signal is outputted to the control circuit 34.

In pattern 3, a signal with a pulse width of 3 μs and over is inputted. In pattern 3, the waveform of the gate voltage is according to the control signal, and an abnormal signal is not outputted.

As stated above, test signals of patterns 1 to 3 are continuously generated, and the CPU installed in the control circuit 34 checks whether the relationship between the test signal pattern and the occurrence of the abnormal signal is identical to the relationship shown in FIG. 9, thereby judging whether the IGBT 31 is normal or not.

According to this embodiment, it is possible to detect malfunction of the isolated signal transmission element caused by high-temperature operation or deterioration by aging as soon as possible and it is also possible to judge whether the IGBT is normal or not. Therefore, it is possible to increase reliability of inverter apparatus for automobiles and inverter apparatus for trains.

What is claimed is:

1. An inverter apparatus comprising:
  a plurality of half bridges in which a first voltage-drive type power semiconductor switching element located on the upper arm and a second voltage-drive type power semiconductor switching element located on the lower arm are connected in series,
  a drive circuit for sending a drive signal to the control electrode of said power semiconductor switching element by using the emitter potential or source potential of said power semiconductor switching element as a reference potential, and
  an isolated signal transmission means for converting an output signal of a control circuit which uses the signal ground potential as a reference potential into an input signal of said drive circuit which uses the emitter potential or source potential of the switching element as a reference potential;
  wherein an abnormal signal discriminating circuit is located between the input section of said drive circuit and said isolated signal transmission means; said abnormal signal discriminating circuit comprising
  an upper-arm side low pass filter for inputting an upper-arm side drive signal,
  a lower-arm side low pass filter for inputting a lower-arm side drive signal,
  a first common mode noise elimination circuit for inputting an output signal of the upper-arm side low pass filter and an output signal of the lower-arm side low pass filter,
  a first filter for inputting an output signal of the first common mode noise elimination circuit, eliminating a part of high frequency band in the frequency band which passed the upper-arm side low pass filter, and outputting the signal to an upper-arm side of said drive circuit,
  a second common mode noise elimination circuit for inputting an output signal of the lower-arm side low pass filter and an output signal of the upper-arm side low pass filter,
  a second filter for inputting an output signal of the second common mode noise elimination circuit, eliminating a part of high frequency band in the frequency band which passed the lower-arm side low pass filter, and outputting the signal to a lower-arm side of the drive circuit, and an abnormal signal output means for inputting an output signal of said first common mode noise elimination circuit, an output signal of said second common mode noise elimination circuit, an abnormal signal outputted by the upper-arm side drive circuit, and an abnormal signal outputted by the lower-arm side drive circuit, and then outputting an abnormal signal.

2. An inverter apparatus according to claim 1, wherein said isolated signal transmission means is an optical isolation element.

* * * * *